United States Patent
Iwai et al.

(10) Patent No.: US 11,152,291 B2
(45) Date of Patent: Oct. 19, 2021

(54) MULTILAYER SUBSTRATE

(71) Applicant: FUJITSU LIMITED, Kawasaki (JP)

(72) Inventors: Toshiki Iwai, Atsugi (JP); Taiji Sakai, Yokohama (JP)

(73) Assignee: FUJITSU INTERCONNECT TECHNOLOGIES LIMITED, Nagano (JP)

( * ) Notice: Subject to any disclaimer, the term of this patent is extended or adjusted under 35 U.S.C. 154(b) by 8 days.

(21) Appl. No.: 16/662,440

(22) Filed: Oct. 24, 2019

(65) Prior Publication Data

US 2020/0152562 A1  May 14, 2020

(30) Foreign Application Priority Data

Nov. 14, 2018  (JP) .............................. JP2018-214108

(51) Int. Cl.
*H01L 23/498* (2006.01)
*H01L 23/15* (2006.01)

(52) U.S. Cl.
CPC ........ *H01L 23/49822* (2013.01); *H01L 23/15* (2013.01); *H01L 23/49894* (2013.01)

(58) Field of Classification Search
CPC ............... H01L 23/49822; H01L 23/15; H01L 23/49894
USPC ....................................................... 257/760
See application file for complete search history.

(56) References Cited

U.S. PATENT DOCUMENTS

| 2013/0027895 | A1 | 1/2013 | Hayashi |
| 2013/0112459 | A1 | 5/2013 | Aoshima et al. |
| 2013/0180769 | A1* | 7/2013 | Aoshima ........... B32B 17/10697 174/258 |
| 2019/0118520 | A1* | 4/2019 | Takahashi ............... B32B 27/38 |
| 2019/0254164 | A1* | 8/2019 | Iwai ......................... H05K 3/46 |

FOREIGN PATENT DOCUMENTS

| JP | 2013-211597 A | 10/2013 |
| WO | 2013/042750 A1 | 3/2013 |

OTHER PUBLICATIONS

Kuramochi et al.; "Glass Interposer Technology Advances for High density Packaging", ICSJ2016, 2016, pp. 213-216 (4 pages).
Wei et al.; "Empirical investigations on Die Edge Defects Reductions in Die Singulation Processes for Glass-Panel Based Interposers for Advanced Packaging", ECTC2015, pp. 1991-1996 (6 pages).

* cited by examiner

*Primary Examiner* — Tong-Ho Kim
(74) *Attorney, Agent, or Firm* — Westerman, Hattori, Daniels & Adrian, LLP

(57) ABSTRACT

A multilayer substrate includes a plurality of plates laminated in a thickness direction of the multilayer substrate, a resin layer provided between the plurality of plates adjacent in the thickness direction, an internal conductive layer provided between the plurality of plates adjacent in the thickness direction, and an external conductive layer provided over an outer surface of each plate of the plurality of plates located at both ends in the thickness direction, wherein a total thickness of the internal conductive layer and the external conductive layer is equal to or less than 25% of a total thickness of the plurality of plates.

5 Claims, 15 Drawing Sheets

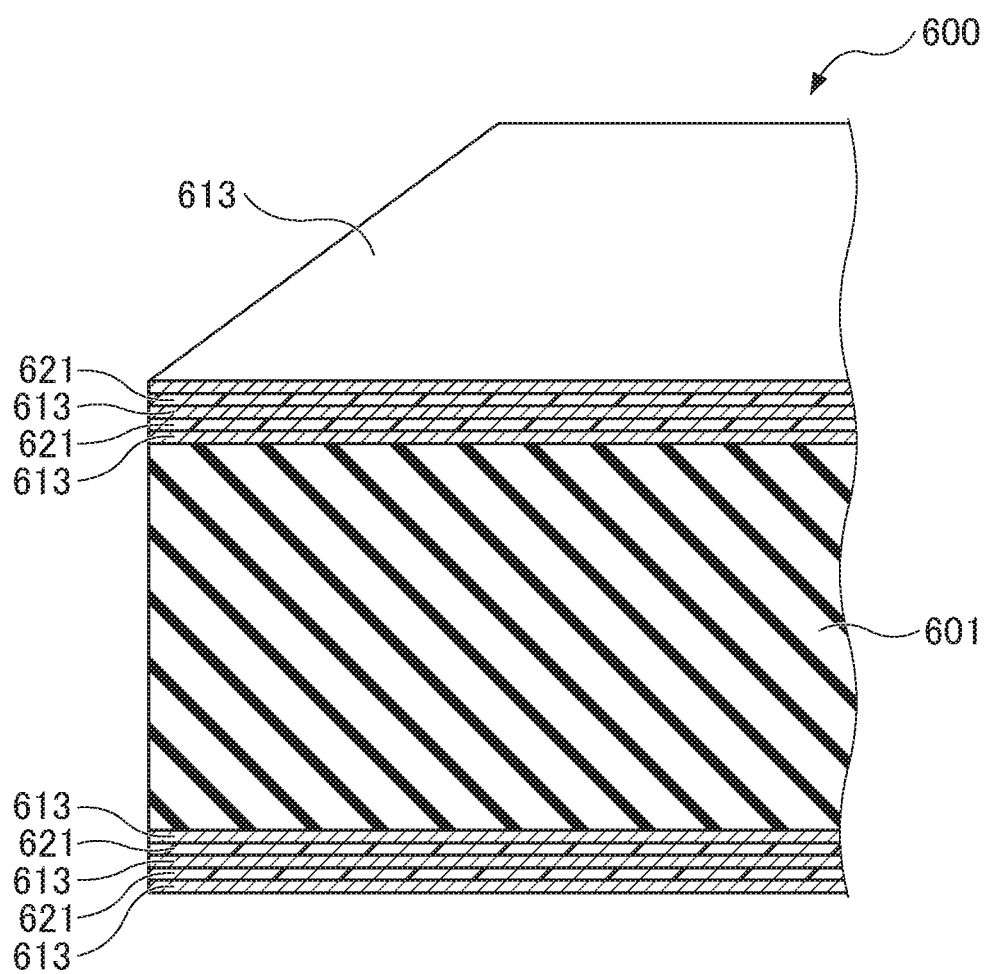

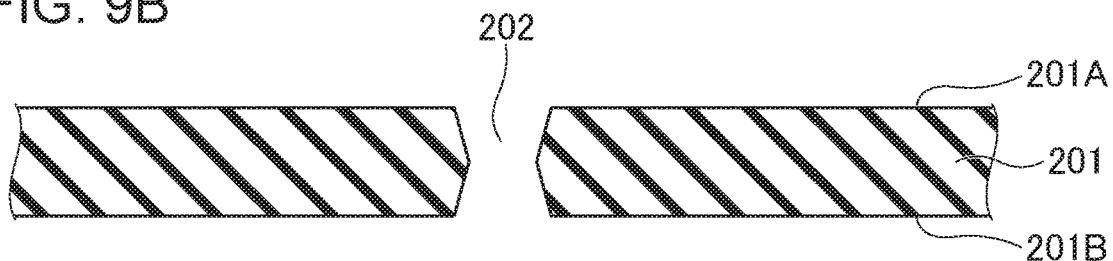
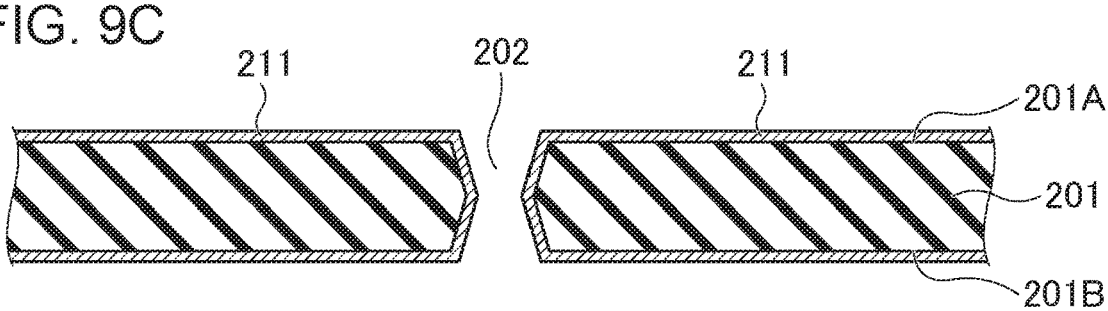
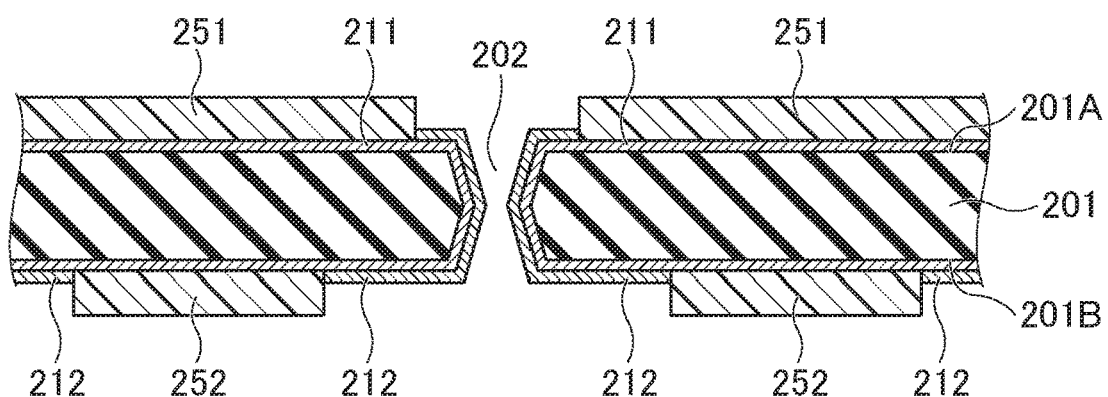
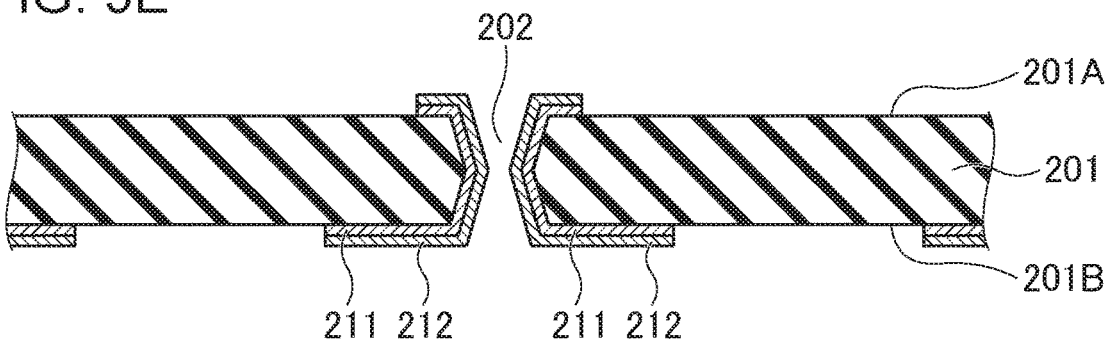

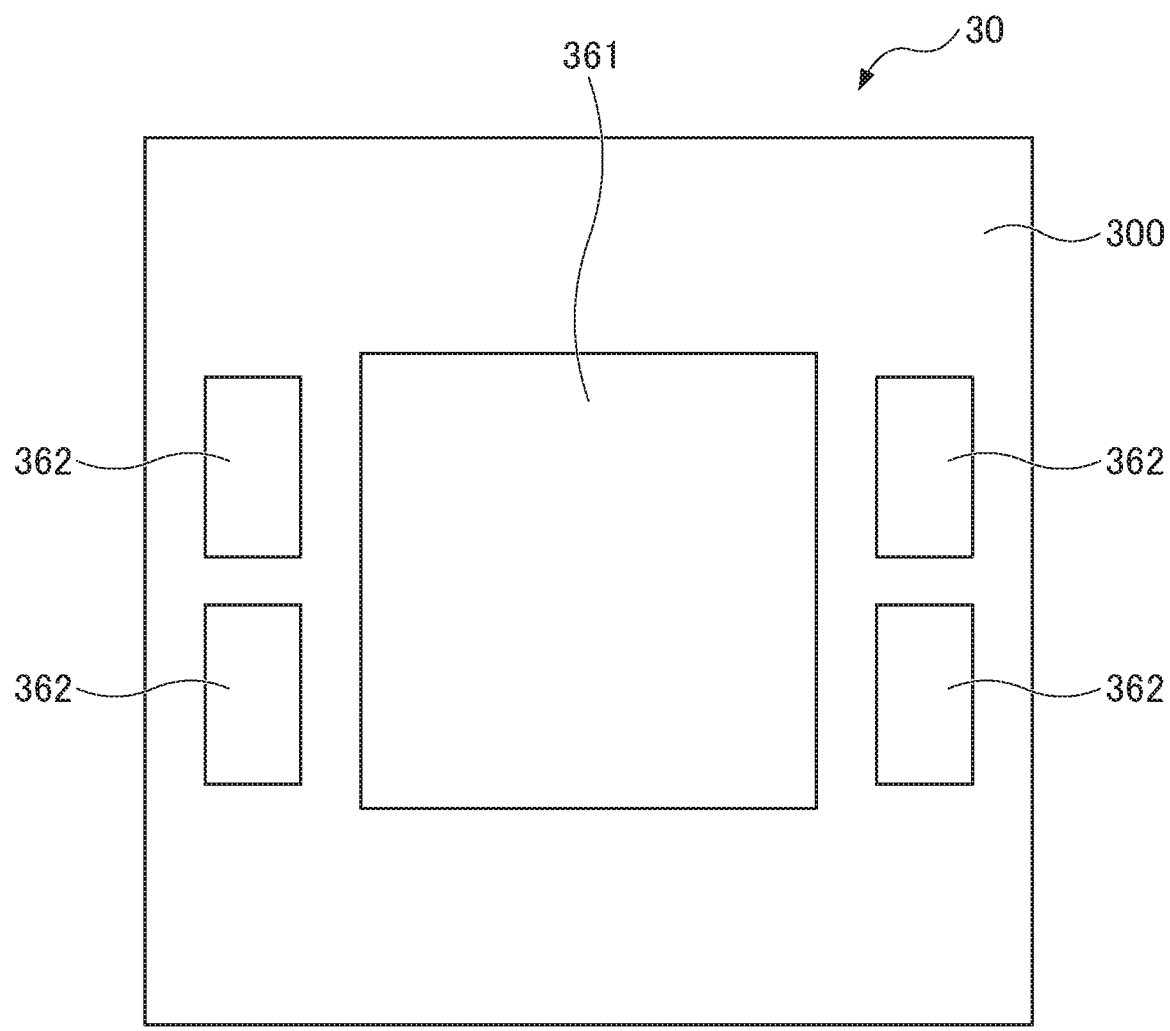

MULTILAYER SUBSTRATE

CROSS-REFERENCE TO RELATED APPLICATION

This application is based upon and claims the benefit of priority of the prior Japanese Patent Application No. 2018-214108, filed on Nov. 14, 2018, the entire contents of which are incorporated herein by reference.

FIELD

The embodiments discussed herein are related to a multilayer substrate.

BACKGROUND

Electronic devices used for high-end servers such as artificial intelligence (AI) and deep learning achieve high performance, and in such electronic devices, a glass interposer is sometimes used as a multilayer substrate capable of mounting semiconductor chips at high density. It is advantageous that the glass interposer is less likely to cause thermal expansion mismatch with the semiconductor chips, and is less expensive than a silicon interposer.

Japanese Laid-open Patent Publication No. 2013-211597 and International Publication Pamphlet No. WO 2013/042750 are examples of related art.

Glass interpreter technology advances for high density packaging, ICSJ 2016 and Empirical investigations on die edge defects reductions in die singulation processes for glass-panel based interposers for advanced packaging, ECTC 2015 are other examples of related art.

SUMMARY

According to an aspect of the embodiments, a multilayer substrate includes a plurality of plates laminated in a thickness direction of the multilayer substrate, a resin layer provided between the plurality of plates adjacent in the thickness direction, an internal conductive layer provided between the plurality of plates adjacent in the thickness direction, and an external conductive layer provided over an outer surface of each plate of the plurality of plates located at both ends in the thickness direction, wherein a total thickness of the internal conductive layer and the external conductive layer is equal to or less than 25% of a total thickness of the plurality of plates.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2B is a perspective diagram illustrating a model of a reference example;

FIG. 9B is a diagram (part 2) illustrating the method of manufacturing the multilayer substrate according to the second embodiment;

FIG. 9C is a diagram (part 3) illustrating the method of manufacturing the multilayer substrate according to the second embodiment;

FIG. 9D is a diagram (part 4) illustrating the method of manufacturing the multilayer substrate according to the second embodiment;

FIG. 9E is a diagram (part 5) illustrating the method of manufacturing the multilayer substrate according to the second embodiment;

FIG. 10 is a plane view illustrating a semiconductor device according to a third embodiment.

DESCRIPTION OF EMBODIMENTS

In a manufacturing process of a glass interposer, in a case that a conductive layer and a resin layer are formed on both surfaces of a core layer, large internal stress is likely to occur at the time of forming the conductive layer and the resin layer, and cracking is likely to occur at the time of cutting after the formation of the conductive layer and the resin layer.

Hereinafter, embodiments of a multilayer substrate capable of reducing cracks in a manufacturing process will be described in detail with reference to the accompanying drawings. In the specification and drawings, constituent elements having substantially the same functional configu-

First Embodiment

Figure 1:
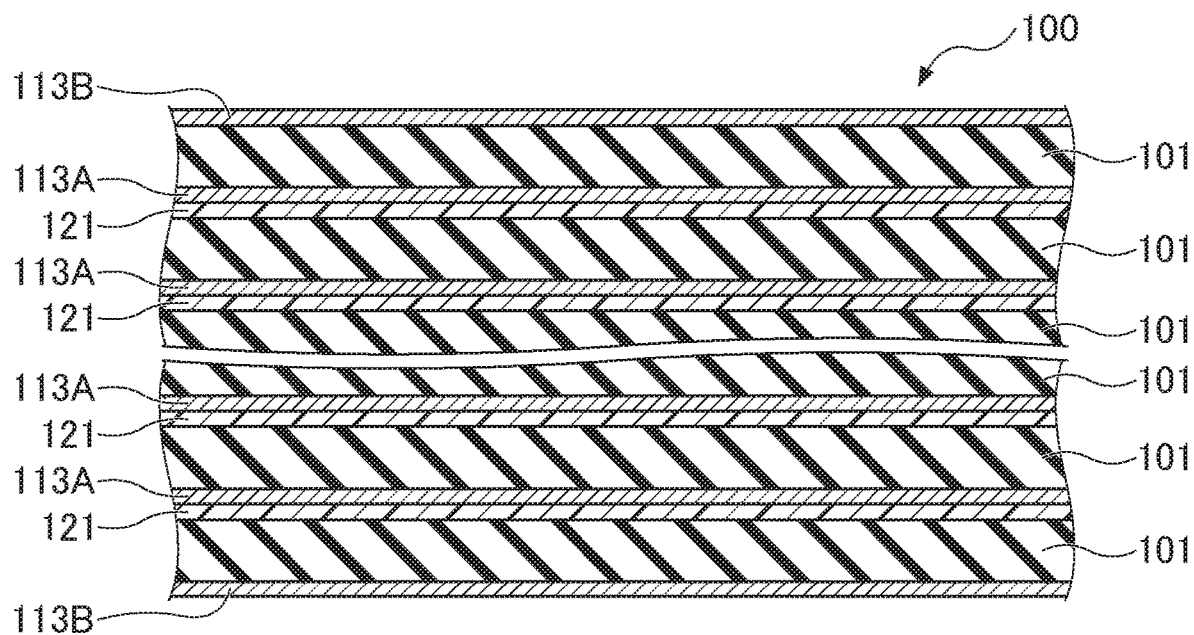
FIG. 1 is a cross-sectional diagram illustrating a multilayer substrate according to a first embodiment.

Firstly, a first embodiment will be described below. FIG. 1 is a cross-sectional diagram illustrating a multilayer substrate according to the first embodiment.

As illustrated in FIG. 1, a multilayer substrate 100 according to the first embodiment includes a plurality of brittle material plates 101 laminated in a thickness direction, resin layers 121 and internal conductive layers 113A provided between the adjacent brittle material plates 101, and external conductive layers 113B provided on outer surfaces of the brittle material plates 101 located on both ends in the thickness direction among the plurality of brittle material plates 101. A total thickness of the internal conductive layers 113A and the external conductive layers 113B is equal to or less than 25% of a total thickness of the brittle material plates 101.

As is apparent from simulation results described later, according to the present embodiment, internal stress of the multilayer substrate 100 may be reduced. Therefore, cracking at the time of cutting may be reduced.

Figure 2A:
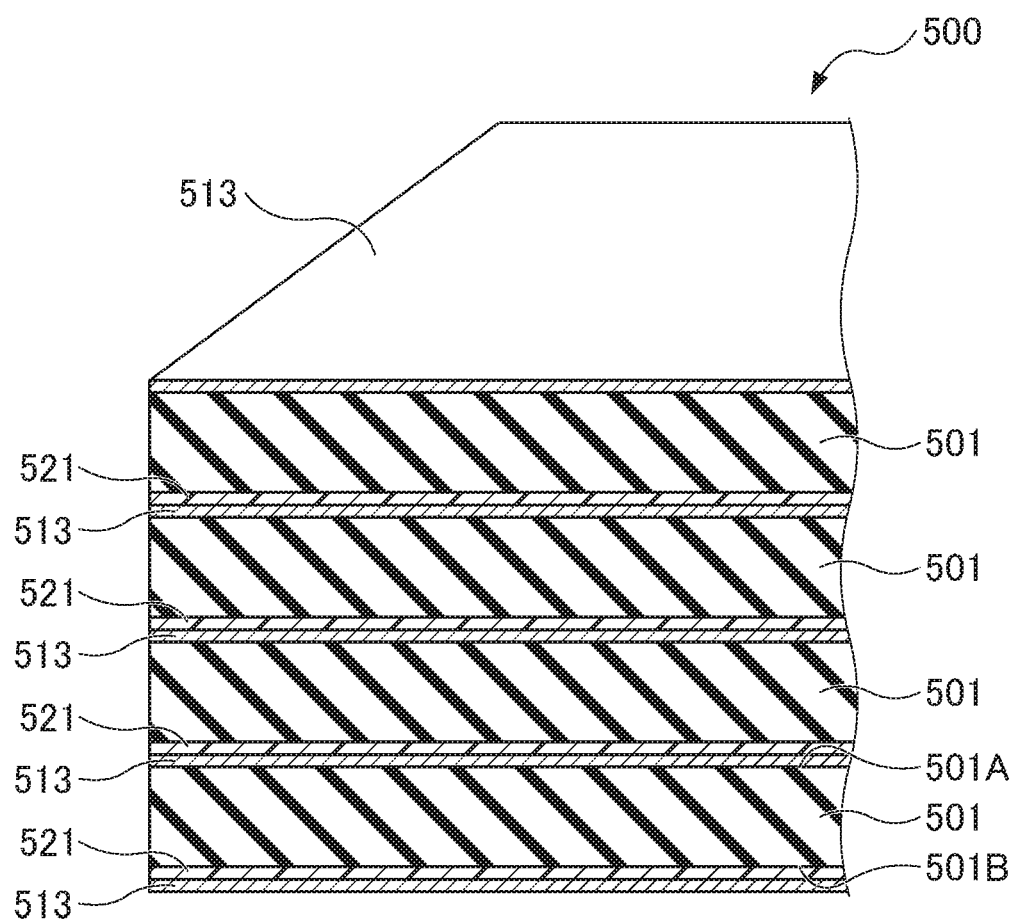
FIG. 2A is a perspective diagram illustrating a model imitating a structure of the first embodiment.

A simulation relating to effect of the first embodiment will be described. FIG. 2A is a perspective diagram illustrating a model imitating a structure of the first embodiment. FIG. 2B is a perspective diagram illustrating a model of a reference example.

In a model 500 illustrated in FIG. 2A, four brittle material plates 501 are laminated in the thickness direction. The brittle material plate 501 has a thickness of 100 μm, and has an elastic modulus of 77 GPa. A conductive layer 513 is formed over a first surface 501A of the brittle material plate 501, and a resin layer 521 is formed over a second surface 501B on a side opposite to the first surface 501A. Accordingly, the resin layer 521 and the conductive layer 513 are sandwiched between adjacent brittle material plates 501. Further, the conductive layer 513 is formed over the resin layer 521 which is not sandwiched by the brittle material plates 501 among four resin layers 521. A thickness of the resin layer 521 is 10 μm, and a thickness of the conductive layer 513 is 10 μm, 20 μm, 30 μm, or 40 μm.

In a model 600 illustrated in FIG. 2B, three conductive layers 613 are formed over a first surface 601A of one brittle material plate 601 while sandwiching a resin layer 621 therebetween. The brittle material plate 601 has a thickness of 300 μm, and has an elastic modulus of 77 GPa. Three conductive layers 613 are also formed over a second surface 601B on a side opposite to the first surface 601A of the brittle material plate 601 while sandwiching the resin layer 621 therebetween. A thickness of the resin layer 621 is 10 μm. The conductive layer 613 has a thickness of 2 μm, 5 μm, or 10 μm.

Figure 3A:
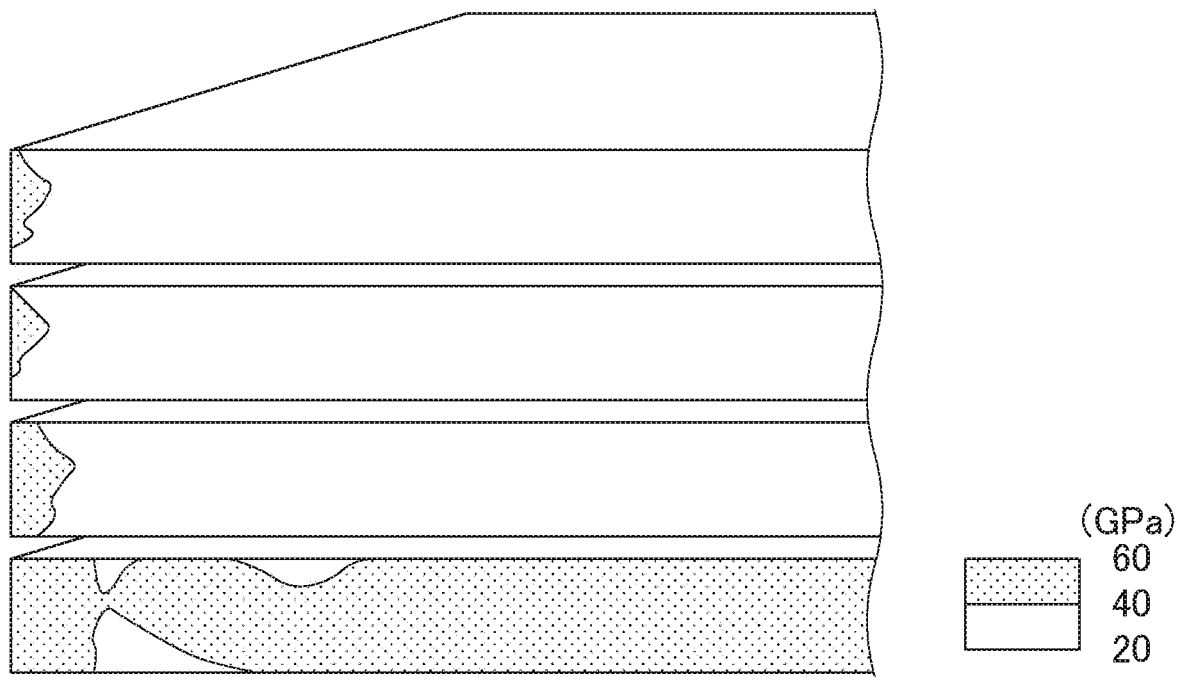
FIG. 3A is a diagram illustrating an example of distribution of internal stress of a brittle material plate of the model imitating the structure of the first embodiment.
Figure 3B:
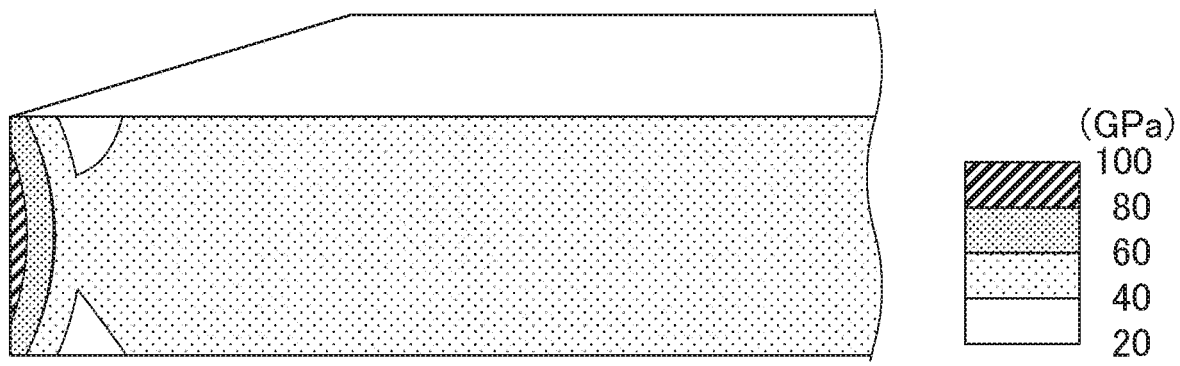
FIG. 3B is a diagram illustrating an example of distribution of internal stress of a brittle material plate of the model of the reference example.
Figure 4:
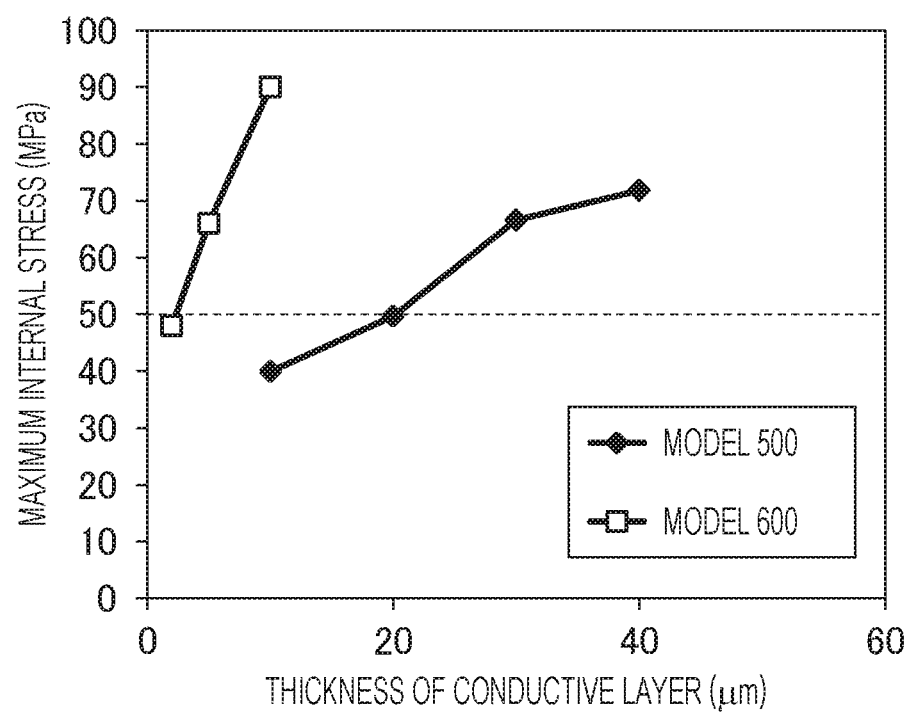
FIG. 4 is a graph illustrating a relationship between thickness of a conductive layer and maximum internal stress.

When the models 500 and 600 are cooled down from 200° C. to 25° C., internal stress generated in the brittle material plate 501 or 601 is calculated, and a maximum value (maximum internal stress) of internal stress is specified for each thickness of the conductive layers 513 and 613. FIG. 3A illustrates an example of distribution of the internal stress of the brittle material plate 501 of the model 500, and FIG. 3B illustrates an example of distribution of the internal stress of the brittle material plate 601 of the model 600. FIG. 3A illustrates the distribution in a case where the thickness of the conductive layer 513 is 10 μm, and FIG. 3B illustrates the distribution in a case where the thickness of the conductive layer 613 is 10 μm. FIG. 4 is a graph illustrating a relationship between the thickness of the conductive layer 513 or 613 and the maximum internal stress. In FIG. 4, the horizontal axis represents the thickness of the conductive layer 513 or 613, and the vertical axis represents the maximum internal stress.

In many cases, the average fracture stress of glass is referred to as about 49 MPa. As illustrated in FIG. 4, in the model 600, the maximum internal stress may not be reduced to equal to or less than 49 MPa, unless the thickness of the conductive layer 613 is made to be 2 μm, which is very thin. On the other hand, in the model 500, when the thickness of the conductive layer 513 is set to equal to or less than 20 μm, the maximum internal stress may be reduced to about equal to or less than 49 MPa. When the thickness of the conductive layer 513 is 20 μm, a total thickness of the brittle material plates 501 is 400 μm, and since a total thickness of the conductive layers 513 is 100 μm, by setting the total thickness of the conductive layers 513 to equal to or less than 25% of the total thickness of the brittle material plates 501, the maximum internal stress may be suppressed to equal to or less than the average fracture stress. In order to more reliably suppress the maximum internal stress to equal to or less than the average fracture stress, the total thickness of the conductive layers 513 is preferably equal to or less than 20%, and more preferably equal to or less than 15%, of the total thickness of the brittle material plates 501.

Figure 5:
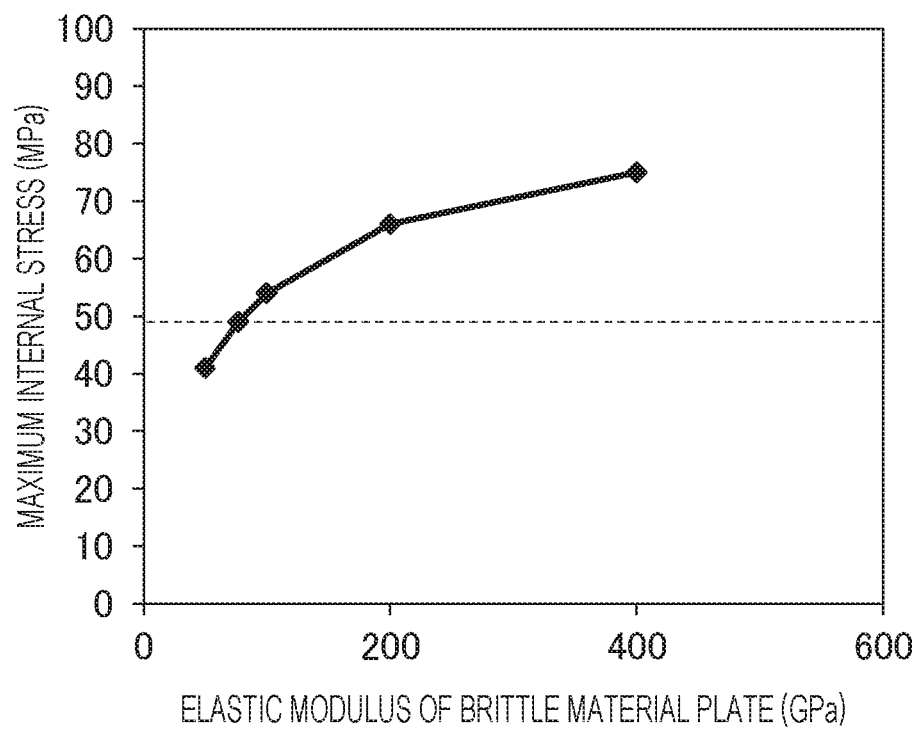
FIG. 5 is a graph illustrating a relationship between an elastic modulus and maximum internal stress of the model imitating the structure of the first embodiment.

The maximum internal stress of the model 500 is also dependent on the elastic modulus of the brittle material plate 501. Therefore, the thickness of the conductive layer 513 is set to 10 μm, and the maximum internal stress when the elastic modulus of the brittle material plate 501 is changed is calculated. FIG. 5 is a graph illustrating a relationship between the elastic modulus and the maximum internal stress of the brittle material plate 501. The horizontal axis in FIG. 5 represents the elastic modulus of the brittle material plate 501, and the vertical axis represents the maximum internal stress.

As illustrated in FIG. 5, when the elastic modulus of the brittle material plate 501 is greater than 80 GPa, the maximum internal stress may be greater than 49 MPa. Therefore, it is preferable that the elastic modulus of the brittle material plate 501 be equal to or less than 80 GPa. As a brittle material plate having the elastic modulus of equal to or less than 80 GPa, for example, glass may be mentioned.

Figure 6:
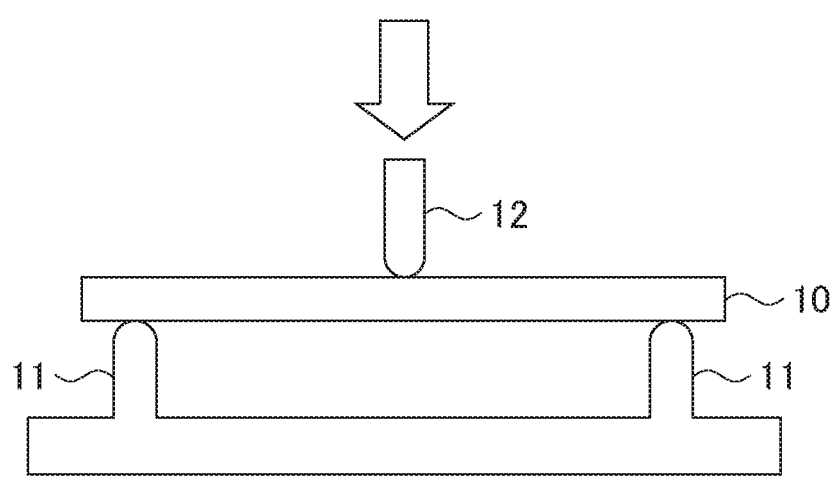
FIG. 6 is a diagram illustrating an outline of a bending test.
Figure 7:
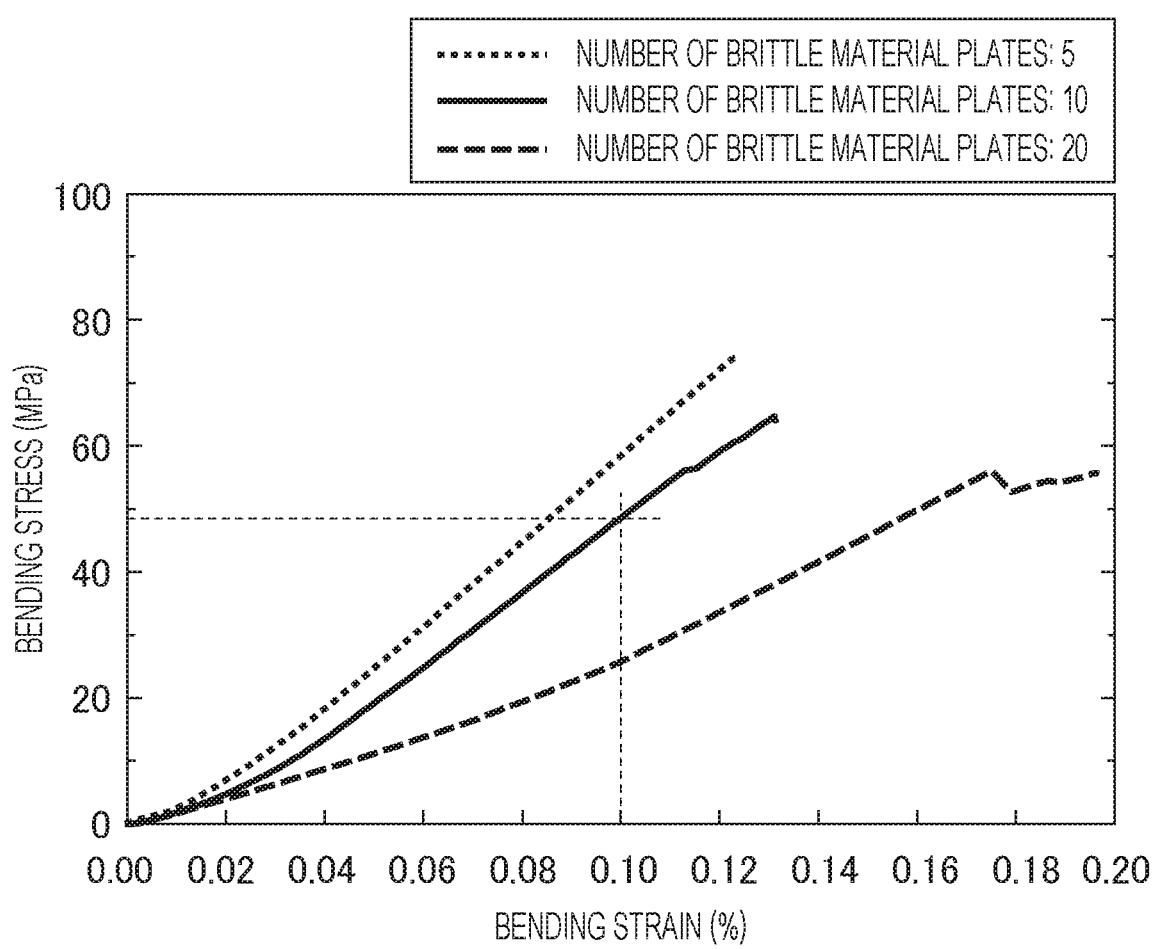
FIG. 7 is a graph illustrating a relationship between bending strain and bending stress.

One of tests for the semiconductor device is a bending test for evaluating external stress resistance. FIG. 6 is a diagram illustrating an outline of the bending test. In this bending test, as illustrated in FIG. 6, a test piece 10 is placed over two fulcrums 11 spaced apart from each other by 30 mm, an indenter 12 is pressed against the middle portion of the fulcrum 11 at a speed of 2 mm/min, and the test piece 10 is bent. The maximum strain of a printed wiring board in a drop impact test of the semiconductor device is referred to as 0.1%. Therefore, it is preferable that the bending stress in a case where 0.1% strain occurs in the multilayer substrate in the bending test be equal to or less than 49 MPa. A relationship between bending strain and bending stress depends on the number of brittle material plates. FIG. 7 is a graph illustrating the relationship between the bending strain and the bending stress. In FIG. 7, the horizontal axis represents the bending strain, and the vertical axis represents the bending stress. In a simulation for obtaining the relationship illustrated in FIG. 7, the thickness of the brittle material plate is set to 100 μm, and the elastic modulus is set to 77 GPa, and the conductive layer having a thickness of 10 μm and the resin layer having a thickness of 10 μm are provided between adjacent brittle material plates.

As illustrated in FIG. 7, the bending stress may be reduced as the number of brittle material plates increases. When the number of brittle material plates is equal to or more than ten, the bending stress may be reduced to equal to or less than 49 MPa for the bending strain of 0.1%. Therefore, it is preferable that the number of brittle material plates included in the multilayer substrate be equal to or more than ten.

Second Embodiment

Figure 8:
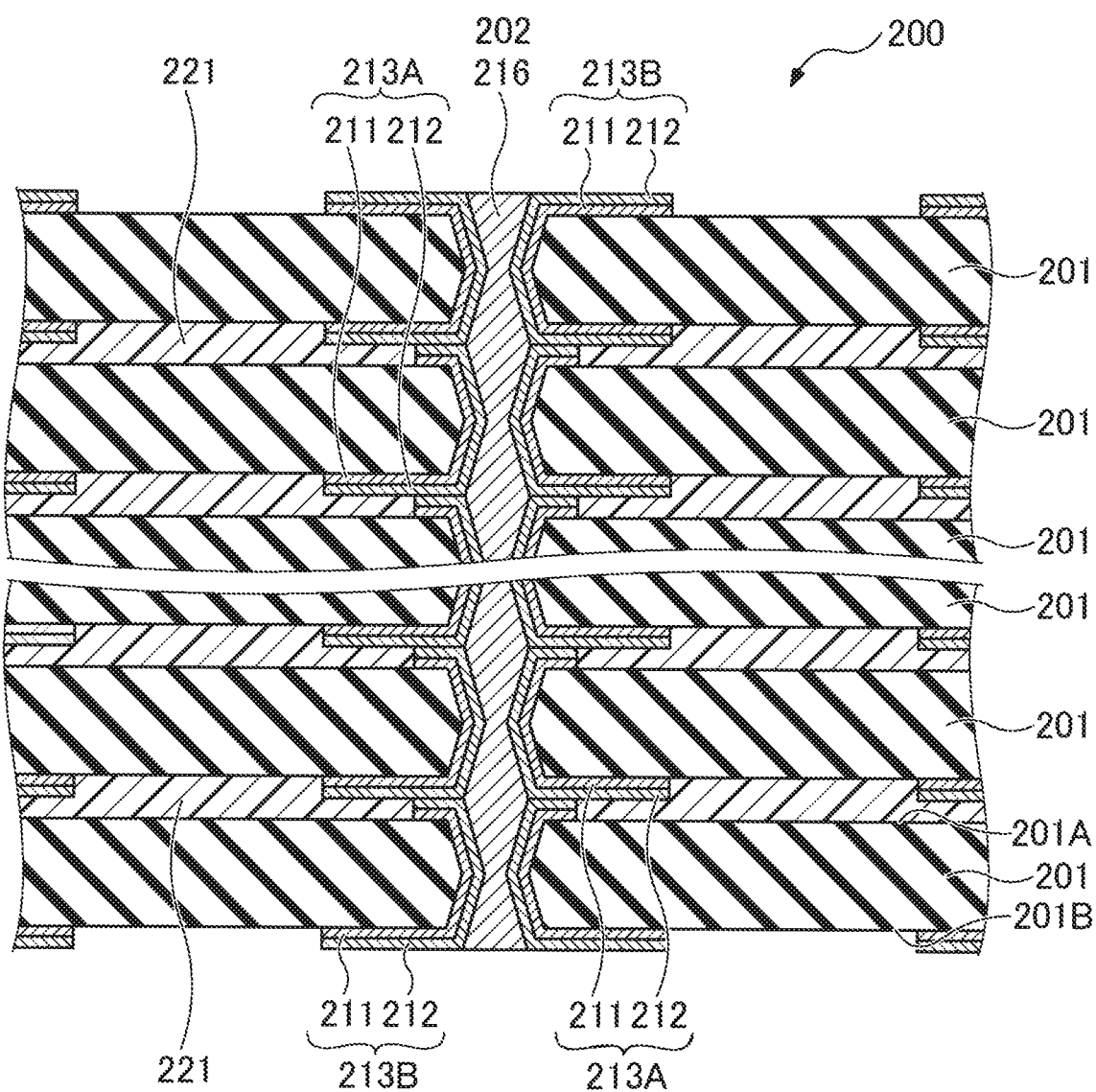
FIG. 8 is a cross-sectional diagram illustrating a multilayer substrate according to a second embodiment.

Next, a second embodiment will be described. FIG. 8 is a cross-sectional diagram illustrating a multilayer substrate according to the second embodiment.

As illustrated in FIG. 8, a multilayer substrate 200 according to the second embodiment includes ten glass plates 201 laminated in a thickness direction, resin layers 221 and internal conductive layers 213A provided between a plurality of adjacent glass plates 201, and external conductive layers 213B provided on outer surfaces of the glass plates 201 located at both ends in the thickness direction among the ten glass plates 201. The glass plate 201 is, for example, a plate of alkali-free glass having a thickness of 80 µm to 120 µm and an elastic modulus of 77 GPa. The resin layer 221 is, for example, a layer of epoxy having a thickness of 1 µm to 40 µm containing glass filler. The internal conductive layer 213A and the external conductive layer 213B include a seed layer 211 and a plating layer 212, and for example, the seed layer 211 includes a titanium (Ti) layer and a copper (Cu) layer, and the plating layer 212 is a Cu layer. The seed layer 211 may be a Cu layer or a Ni layer. For example, the internal conductive layer 213A and the external conductive layer 213B have a thickness of 1 µm to 40 µm. A thermosetting material other than epoxy may be used as the resin layer 221, a thermoplastic material, for example, polyimide may be used, and a liquid crystal polymer or the like may be used.

A through-hole 202 is formed in the glass plate 201, and the seed layer 211 and the plating layer 212 are also formed on the inner surface of the through-hole 202. An inside of the through-hole 202 is filled with a conductive paste 215. A radius of the through-hole 202 is, for example, 10 µm to 20 µm, and the conductive paste 215 is, for example, a silver (Ag) paste, a solder paste, a metal complex paste, or a nano paste. As the solder, for example, an alloy containing two or more kinds of metals such as tin (Sn), copper (Cu), bismuth (Bi), silver (Ag), lead (Pb), nickel (Ni) and the like may be used.

In one glass plate 201 located at the lowermost position among the ten glass plates 201, the resin layer 221 is formed almost entirely over a first surface (upper surface) 201A, and the external conductive layer 213B is formed over a second surface (lower surface) 201B on a side opposite to the first surface 201A.

In one glass plate 201 located at the uppermost position among the ten glass plates 201, the external conductive layer 213B is formed over the first surface 201A, and the internal conductive layer 213A is formed over the second surface 201B. The external conductive layer 213B and the internal conductive layer 213A are formed integrally with the seed layer 211 and the plating layer 212 in the through-hole 202, for example.

In remaining eight glass plates 201 among the ten glass plates 201, the resin layer 221 is formed almost entirely over the first surface 201A, and the internal conductive layer 213A is formed over the second surface 201B.

The internal conductive layer 213A and the external conductive layer 213B are electrically coupled to each other through the conductive paste 215 in the through-hole 202.

In the multilayer substrate 200 configured as described above, a total thickness of the glass plates 201 is 1000 µm, and a total thickness of the internal conductive layers 213A and the external conductive layers 213B is 110 µm. That is, the total thickness of the internal conductive layers 213A and the external conductive layers 213B is 11% of the total thickness of the glass plates 201, and is equal to or less than 25%. Therefore, as is clear from the simulation in the first embodiment, the internal stress generated in the glass plate 201 is reduced to equal to or less than 49 MPa, so that cracking at the time of cutting may be suppressed.

Next, a method for manufacturing the multilayer substrate 200 according to the second embodiment will be described. FIG. 9A to FIG. 9J are diagrams illustrating the method of manufacturing the multilayer substrate 200 according to the second embodiment.

Figure 9A:
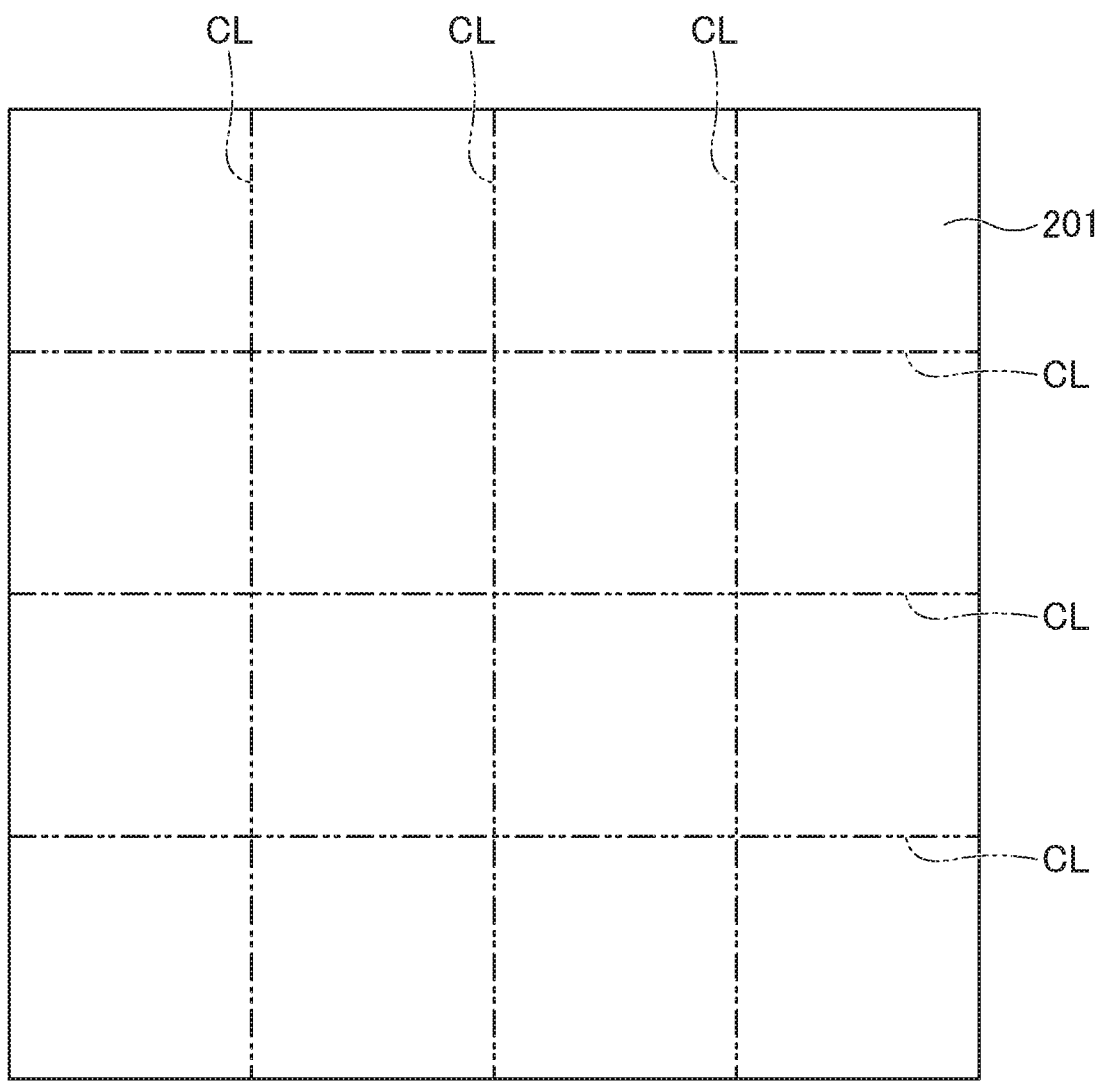
FIG. 9A is a diagram (part 1) illustrating a method of manufacturing the multilayer substrate according to the second embodiment.

In this manufacturing method, as illustrated in FIG. 9A, ten glass plates 201 having a size corresponding to, for example, 16 multilayer substrates 200 are prepared. Nine lamination units 291 including the glass plates 201, the conductive layers 213, and the resin layers 221 are formed, and one lamination unit 292 including the glass plate 201 and the conductive layer 213, but not including the resin layer 221 is formed, and these are laminated and hot-pressed. Thereafter, the glass plate 201 is cut along a cut line CL in FIG. 9A to manufacture 16 multilayer substrates 200. FIG. 9B to FIG. 9J illustrate cross-sectional diagrams of a portion of a region where one multilayer substrate 200 is formed.

In the formation of the lamination unit 291, as illustrated in FIG. 9B, the through-hole 202 is formed in the glass plate 201. The through-hole 202 may be formed by using, for example, a laser. The through-hole 202 may be formed by drilling.

Then, as illustrated in FIG. 9C, the seed layer 211 is formed on both surfaces of the glass plate 201 and on the inner surface of the through-hole 202. In the formation of the seed layer 211, a Ti layer and a Cu layer are formed by a sputtering method, for example. As the seed layer 211, a Cu layer may be formed by an electroless plating method.

Thereafter, as illustrated in FIG. 9D, a mask 251 is formed over the seed layer 211 on the first surface 201A side of the glass plate 201, and a mask 252 is formed over the seed layer 211 on the second surface 201B side. As illustrated in FIG. 9D, the mask 251 does not cover the through-hole 202. The inner diameter of the mask 251 may be made larger than the through-hole 202. The mask 252 does not cover the through-hole 202 and does not cover a region where the conductive layer 213 is to be formed on the second surface 201B side. Subsequently, the plating layer 212 is formed over the seed layer 211 not covered by the masks 251 and 252 by an electrolytic plating method using the seed layer 211 as a power feeding path.

Then, as illustrated in FIG. 9E, the masks 251 and 252 are removed. Thereafter, portions of the seed layer 211 not covered by the plating layer 212 are removed. A remaining portion of the seed layer 211 and the plating layer 212 are included in the internal conductive layer 213A or the external conductive layer 213B.

Figure 9F:
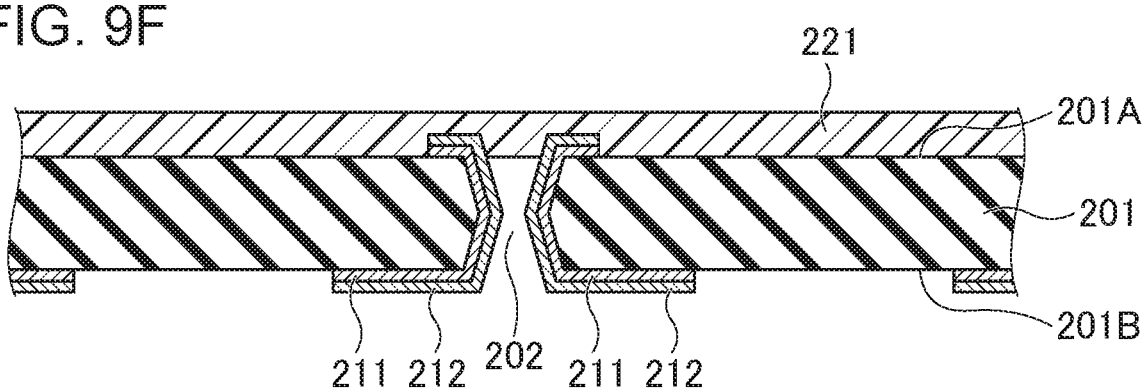
FIG. 9F is a diagram (part 6) illustrating the method of manufacturing the multilayer substrate according to the second embodiment.

Thereafter, as illustrated in FIG. 9F, the resin layer 221 is formed over the first surface 201A. In the formation of the resin layer 221, for example, a dry film resist is applied to the first surface 201A. A thickness of the resin layer 221 is preferably set to less than or equal to twice a radius at an end portion of the through-hole 202, that is, the radius at the first surface 201A. For example, when the radius at the end portion of the through-hole 202 is 20 μm, it is preferable to use a dry film resist having a thickness of equal to or less than 40 μm as the resin layer 221. This is because when the resin layer 221 is too thick, it becomes difficult to be filled with the conductive paste 215, which will be described later, or the resin layer 221 softened during the hot pressing hinders conduction in the thickness direction.

Figure 9G:
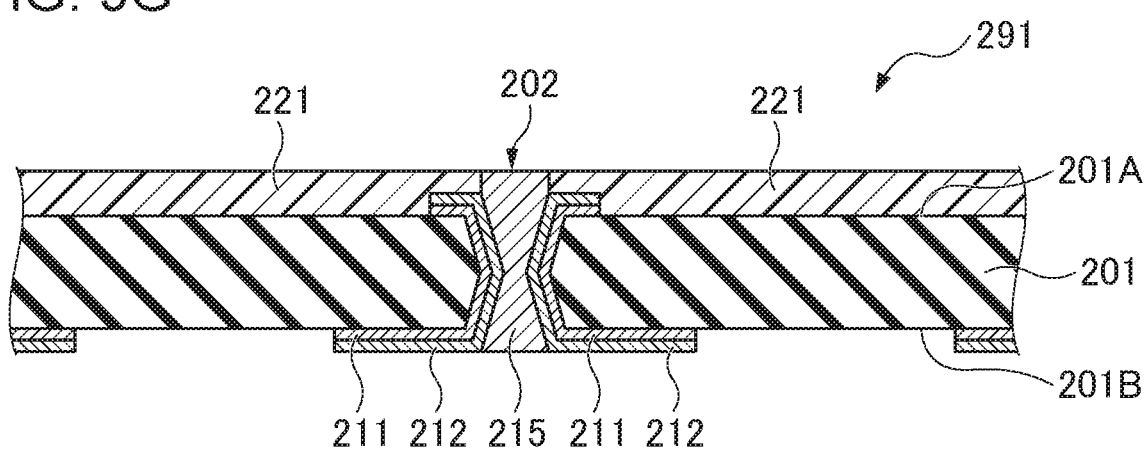
FIG. 9G is a diagram (part 7) illustrating the method of manufacturing the multilayer substrate according to the second embodiment.

Subsequently, as illustrated in FIG. 9G, an opening exposing the through-hole 202 is formed in the resin layer 221, and an inside of the through-hole 202 is filled with the conductive paste 215. The filling of the conductive paste 215 may be carried out by a printing method, for example.

In this manner, a lamination unit 291 including the glass plate 201, the resin layer 221, and the conductive layer 213 is formed. In manufacturing the multilayer substrate 200, these nine lamination units 291 are formed.

Figure 9H:
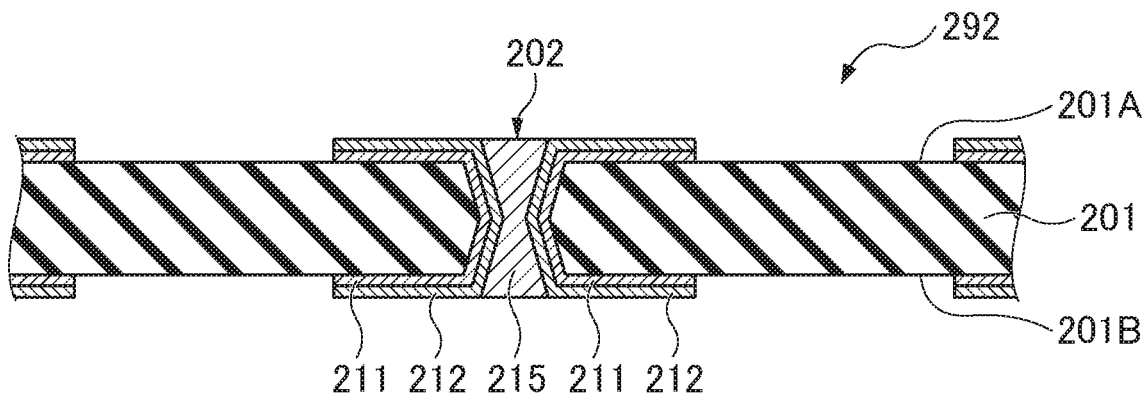
FIG. 9H is a diagram (part 8) illustrating the method of manufacturing the multilayer substrate according to the second embodiment.

The lamination unit 292 may be formed in substantially the same manner as the formation method of the lamination unit 291. The differences from the method of forming the lamination unit 291 are mainly the following points. First, as a mask formed on the first surface 201A side of the glass plate 201, a mask is used not to cover the through-hole 202 and not to cover a region where the external conductive layer 213B is to be formed on the first surface 201A side. Second, the inside of the through-hole 202 is filled with the conductive paste 215 without forming the resin layer 221. In this manner, as illustrated in FIG. 9H, the lamination unit 292 may be formed.

Figure 9I:
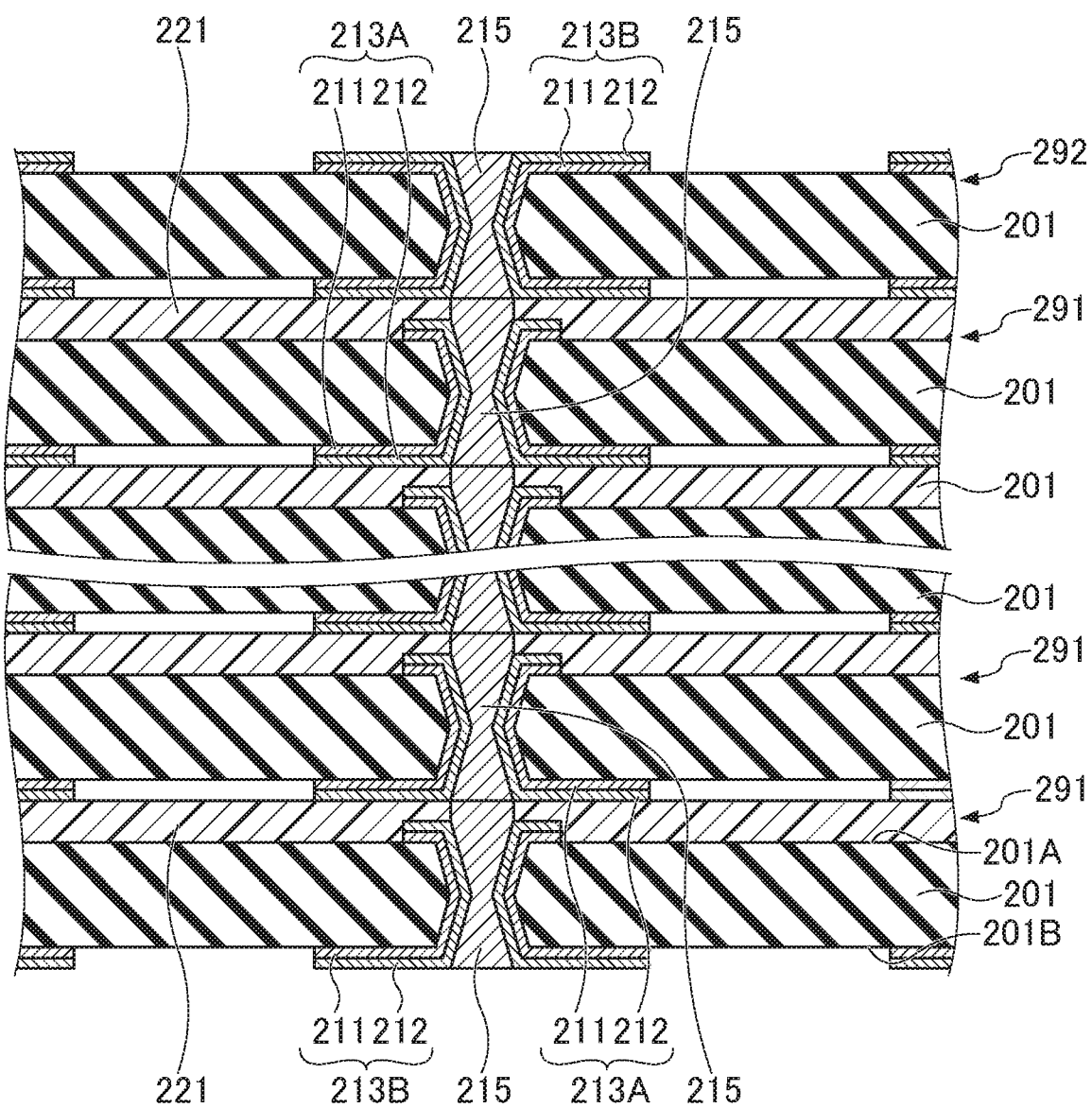
FIG. 9I is a diagram (part 9) illustrating the method of manufacturing the multilayer substrate according to the second embodiment.

After nine lamination units 291 and one lamination unit 292 are prepared, nine lamination units 291 are laminated, and one lamination unit 292 are laminated thereon, as illustrated in FIG. 9I. At this time, the first surface 201A and the second surface 201B are opposed to each other between the glass plates 201 adjacent to each other in the lamination direction.

Figure 9J:
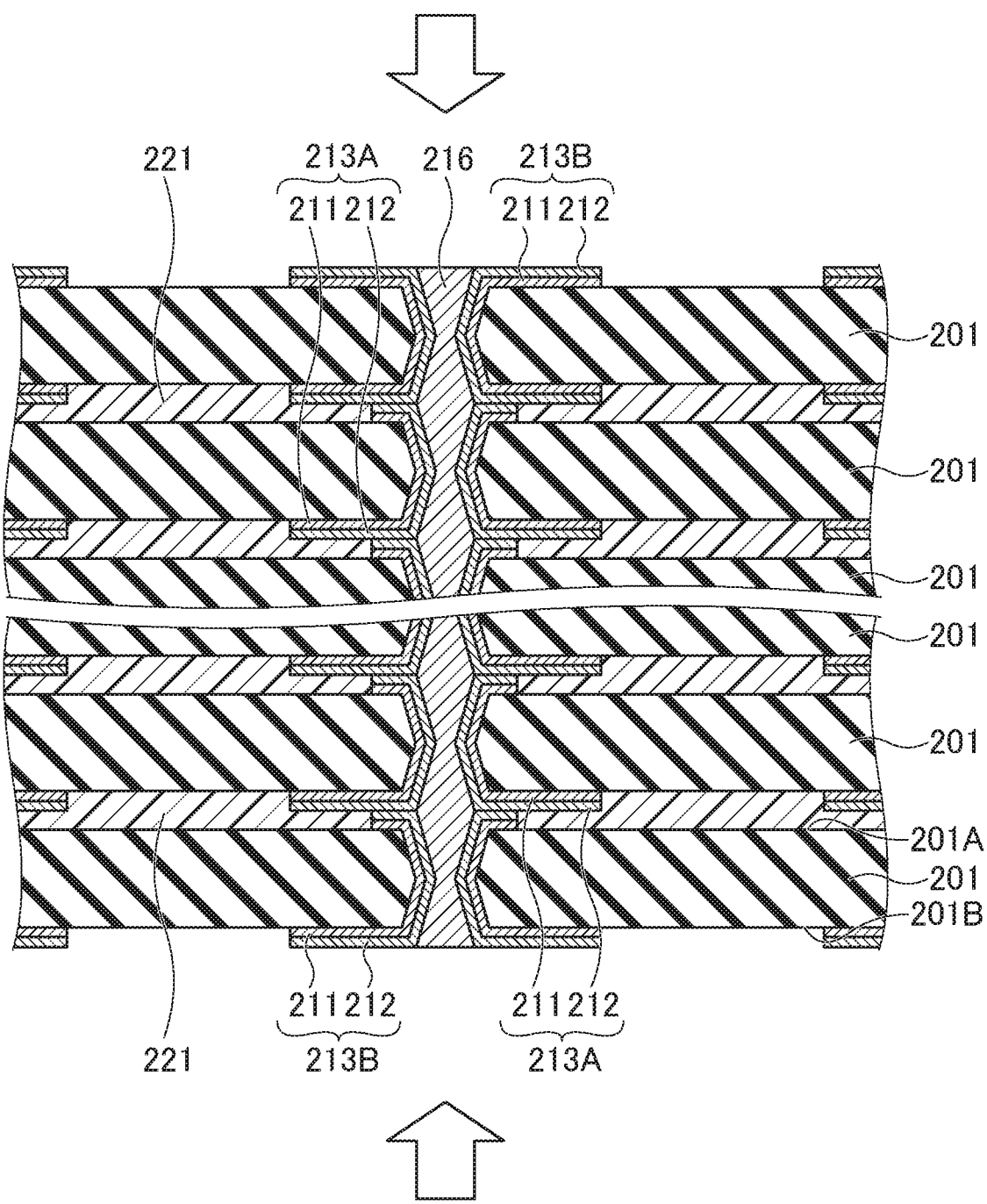
FIG. 9J is a diagram (part 10) illustrating the method of manufacturing the multilayer substrate according to the second embodiment.

Then, as illustrated in FIG. 9J, a laminated body of nine lamination units 291 and one lamination unit 292 is hot-pressed in the lamination direction. As a result, between the glass plates 201 adjacent to each other in the lamination direction, the resin layer 221 over the first surface 201A of one glass plate 201 is also adhered to the second surface 201B of another glass plate 201, and two glass plates 201 are firmly adhered to each other by the resin layer 221. A conductive via 216 is formed by softening and then curing each conductive paste 215 to be integrated each other.

In this manner, the multilayer substrate 200 according to the second embodiment may be manufactured.

When the thickness of the resin layer 221 formed over the first surface 201A is less than or equal to twice the radius at the end portion of the through-hole 202, the thickness of the resin layer 221 in the resultant multilayer substrate 200 is less than or equal to twice the radius at the end portion of the through-hole 202.

Third Embodiment

Figure 11:
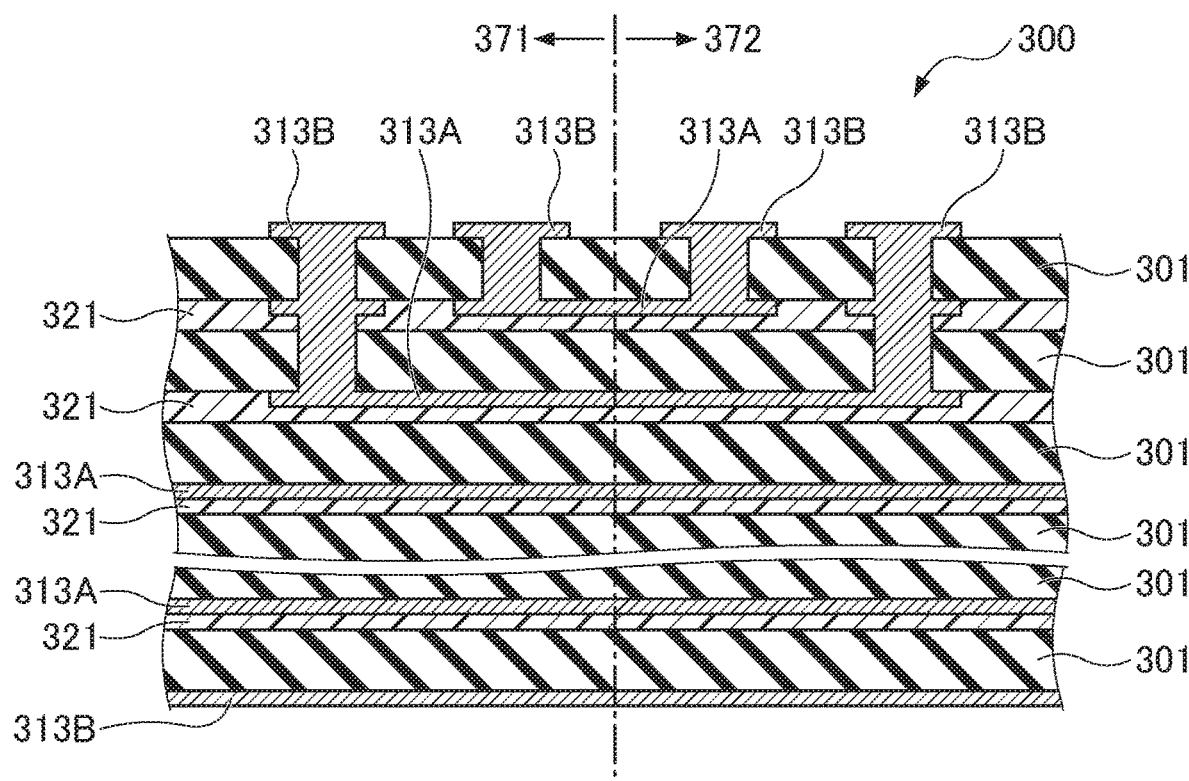
FIG. 11 is a cross-sectional diagram illustrating a multilayer substrate included in the semiconductor device according to the third embodiment.

A third embodiment relates to a semiconductor device including a multilayer substrate. FIG. 10 is a plane view of a semiconductor device according to the third embodiment. FIG. 11 is a cross-sectional diagram illustrating the multilayer substrate included in the semiconductor device according to the third embodiment.

As illustrated in FIG. 10, a semiconductor device 30 according to the third embodiment includes a multilayer substrate 300, a central processing unit (CPU) 361, and memory chips 362. In plane view, the multilayer substrate 300 has a rectangular shape, the CPU 361 is mounted on the center of the multilayer substrate 300, and the memory chips 362 are mounted on the periphery of the CPU 361.

As illustrated in FIG. 11, the multilayer substrate 300 includes a plurality of glass plates 301 laminated in a thickness direction, resin layers 321 and internal conductive layers 313A provided between a plurality of adjacent glass plates 301, and external conductive layers 313B provided on outer surfaces of the glass plates 301 located at both ends in the thickness direction among the plurality of glass plates 301. The glass plate 301, the resin layer 321, the internal conductive layer 313A, and the external conductive layer 313B are configured in the same manner as the glass plate 201, the resin layer 221, the internal conductive layer 213A, and the external conductive layer 213B in the second embodiment, except for the arrangement position.

In the third embodiment, as illustrated in FIG. 11, the external conductive layer 313B in a CPU mounting region 371 in which the CPU 361 is mounted and the external conductive layer 313B in a memory chip mounting region 372 in which the memory chip 362 is mounted are electrically coupled to each other through the internal conductive layer 313A. Although not illustrated in FIG. 11, similarly to the second embodiment, a path is also provided to electrically couple from the external conductive layer 313B over one surface (upper surface) of the multilayer substrate 300 to the external conductive layer 313B over another surface (lower surface) of the multilayer substrate 300.

In this manner, the multilayer substrate 300 includes not only a path for electrically coupling the external conductive layers 313B on both sides in a lamination direction (thickness direction), but also a path for electrically coupling two external conductive layers 313B on one surface side. Therefore, the CPU 361 and the memory chip 362 may be coupled to each other through the multilayer substrate 300 by a short signal path.

Although the present disclosure is suitable for glass which is particularly inexpensive and easy to crack among brittle materials, the material of the brittle material plate is not limited to glass. For example, as a material of the brittle material plate, diamond, ceramic, silicon, glass, gallium nitride (GaN), sapphire, or the like may be used.

The thickness of each of the brittle material plate, the resin layer, and the conductive layer is not necessarily required to be uniform.

In the entire multilayer substrate, the brittle material plate and the resin layer and the internal conductive layer provided between adjacent brittle material plates are not necessarily required to be laminated, and in some layers of the multilayer substrate, the brittle material plate and the resin layer and the internal conductive layer provided between adjacent brittle material plates may be laminated. For example, a resin substrate such as a glass epoxy substrate may be used as another part of the multilayer substrate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A multilayer substrate comprising:
a plurality of plates laminated in a thickness direction of the multilayer substrate;
a resin layer provided between the plurality of plates adjacent in the thickness direction;
an internal conductive layer provided between the plurality of plates adjacent in the thickness direction; and
an external conductive layer provided over an outer surface of each plate of the plurality of plates located at both ends in the thickness direction,
wherein a total thickness of the internal conductive layer and the external conductive layer is equal to or less than 25% of a total thickness of the plurality of plates, and
wherein the plate is a glass plate.

2. The multilayer substrate according to claim 1, wherein the total thickness of the internal conductive layer and the external conductive layer is equal to or less than 20% of the total thickness of the plurality of plates.

3. The multilayer substrate according to claim 1, wherein a plate of the plurality of plates has brittle properties, and an elastic modulus of the plate is equal to or less than 80 GPa.

4. The multilayer substrate according to claim 1, wherein the plurality of plates include equal to or more than ten plates.

5. The multilayer substrate according to claim 1, wherein the plate, the resin layer, and the internal conductive layer are laminated in some layers of the multilayer substrate.

* * * * *